United States Patent
Abhishek et al.

(10) Patent No.: US 9,473,121 B1
(45) Date of Patent: Oct. 18, 2016

(54) SCANNABLE FLIP-FLOP AND LOW POWER SCAN-SHIFT MODE OPERATION IN A DATA PROCESSING SYSTEM

(71) Applicant: FREESCALE SEMICONDUCTOR, INC., Austin, TX (US)

(72) Inventors: Kumar Abhishek, Austin, TX (US); Gaurav Goyal, Greater Noida (IN); Syed Shakir Iqbal, New Delhi (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/799,903

(22) Filed: Jul. 15, 2015

(51) Int. Cl.
  H03K 3/356 (2006.01)
  H03K 3/3562 (2006.01)

(52) U.S. Cl.
  CPC .... H03K 3/356104 (2013.01); H03K 3/35625 (2013.01)

(58) Field of Classification Search
  CPC .. H03K 3/35625; H03K 3/02; H03K 3/0375; H03K 5/133; H03K 19/0016; H03K 19/0963; H03K 19/215; H03K 23/005
  USPC ............... 327/198, 199, 200, 202, 203
  See application file for complete search history.

(56) References Cited

U.S. PATENT DOCUMENTS

| | | |
|---|---|---|
| 8,378,728 B1 | 2/2013 | Goyal et al. |
| 2001/0038550 A1 | 11/2001 | Whetsel |
| 2009/0262588 A1* | 10/2009 | Vilangudi-pitchai ............ H03K 3/356147 365/189.11 |
| 2011/0199139 A1 | 8/2011 | Arora et al. |

OTHER PUBLICATIONS

Mehta et al, "Low Power Efficient D Flip Flop Circuit", International Symposium on Devices MEMS, Intelligent Systems & Communication (ISDMISC), 2011, pp. 16-19.
Ahmadi, A Power Efficient Hold-Friendly Flip-Flop, Joint 6th International IEEE Northeast Workshop on Circuits and Systems and TAISA Conference, Jun. 22-25, 2008, pp. 81-84, Montreal, QC.

* cited by examiner

*Primary Examiner* — John Poos

(57) ABSTRACT

A scannable flip-flop circuit and method for low power scan operation are provided. The scannable flip-flop includes a flip-flop for receiving an input signal, and for generating a flip-flop output signal. The scannable flip-flop also includes a voltage selection circuit coupled to the flip-flop. The voltage selection circuit supplies a first voltage to the flip-flop during a first state of a voltage selection signal, and supplies a second voltage to the flip-flop during a second state of the voltage selection signal. A series of scannable flip-flops may be arranged in a scan chain for testing during a scan test mode.

20 Claims, 4 Drawing Sheets

US 9,473,121 B1

SCANNABLE FLIP-FLOP AND LOW POWER SCAN-SHIFT MODE OPERATION IN A DATA PROCESSING SYSTEM

BACKGROUND

1. Field

This disclosure relates generally to data processing, and more specifically, to a scannable flip-flop in low power operating modes, including scan-shift mode, in a data processing system.

2. Related Art

Many integrated circuits include a plurality of flip-flops that are used to provide logic operations during normal operating modes and for testing the integrated circuit during a scan-shift mode. During testing, the flip-flops are formed in a scan-chain and test data is scanned through the scan-chain. When the integrated circuit is operating in scan-shift mode, the system clock runs at a slower speed while data is clocked though the flip-flops. In scan-shift mode, all of the flip-flops operate at the same time causing a large current flow thus increased demand on the power supply and increased power consumption. The large current can be reduced by staggering the operation of the flip-flops. However, staggering the operation significantly increases the amount of time required to complete the scan testing operation. Also, there may be a problem with "hold violations" during scanning because clock signals provided to subsequent flip-flops in the chain are delayed from a beginning flip-flop and the scan data is running faster than the delayed clock.

Therefore, a need exists for a scan-shift operating mode with lower power consumption and a reduced number of hold violations.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
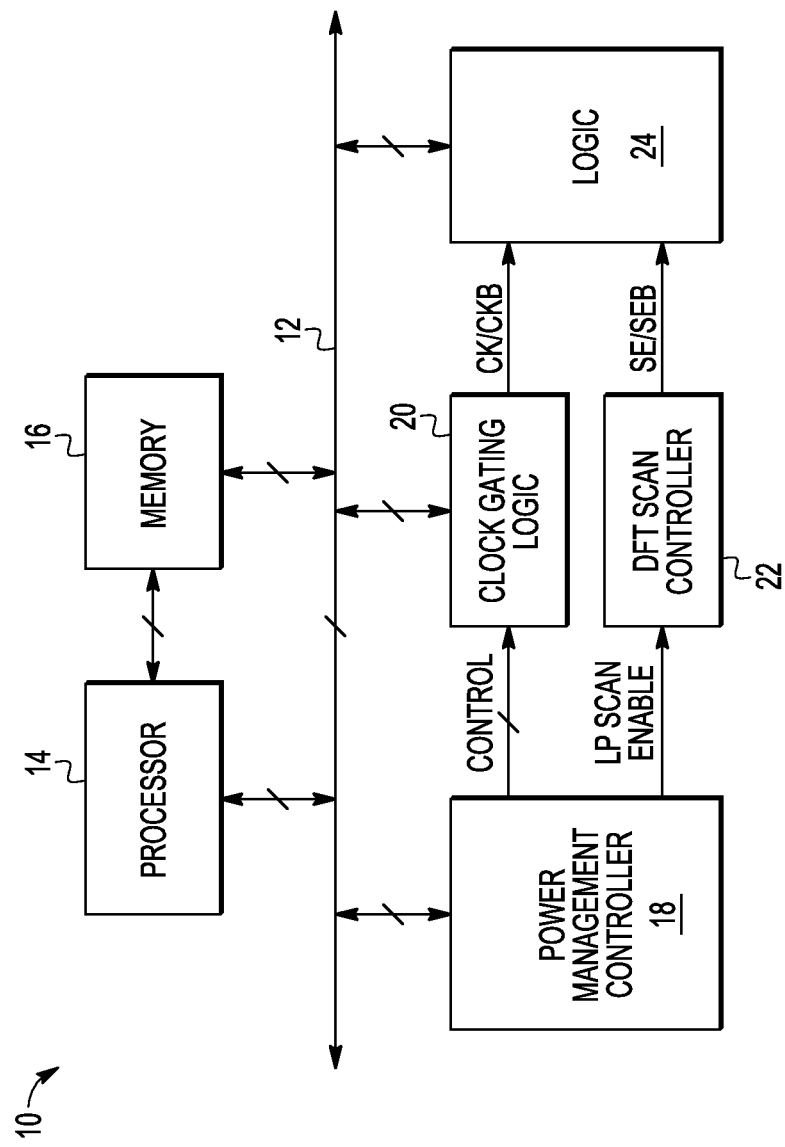
FIG. 1 illustrates, in block diagram form, a data processing system in accordance with an embodiment.

Generally, there is provided, a data processing system having lower power consumption during a scan-shift mode and during a low power mode, such as stop mode, of the data processing system by selectively reducing the supply voltage to the flip-flops when the data processing system is operating in scan-shift mode and low power mode. The supply voltage to the flip-flops is reduced in response to a scan enable (SE) signal being asserted in both the scan-shift mode and the low power mode. The supply voltage is reduced without the need to provide additional power supply voltages to the data processing system. A level shifter is provided to restore the voltage swing of the shifted signals. Lowering the power supply voltage to the flip-flops slows the data signal path to more closely match the reduced clock frequency. Reducing the supply voltage during the scan-shift operating mode reduces power consumption while also reducing the number of hold violations during a scan-shift operation. Also, reducing the flip-flop supply voltage during the low power mode further reduces power consumption by reducing leakage current.

In one embodiment, there is provided, a scannable flip-flop comprising: a flip-flop for receiving an input signal, and for generating a flip-flop output signal; and a voltage selection circuit coupled to the flip-flop, the voltage selection circuit for supplying a first voltage to the flip-flop during a first state of a voltage selection signal, and for supplying a second voltage to the flip-flop during a second state of the voltage selection signal. The scannable flip-flop may further comprise a level shifter coupled to the flip-flop, the level shifter for receiving the flip-flop output signal and for generating an output signal. During the second state of the voltage selection signal, the second voltage may be supplied to the flip-flop and the first voltage is supplied to the level shifter. The first voltage may be characterized as VDD and the second voltage may be lower than VDD. The second voltage may be substantially a threshold voltage below VDD. The voltage selection circuit may comprise: a P-channel transistor having a first current electrode coupled to a VDD voltage supply, a control electrode coupled to the voltage selection signal, and a second current electrode for providing the first voltage; and an N-channel transistor having a first current electrode coupled to a VDD voltage supply, a control electrode coupled to the voltage selection signal, and a second current electrode for providing the second voltage. The voltage selection signal may be characterized as a scan enable signal. The voltage selection signal may be in the second state during a low power mode. The flip-flop may receive a clock signal, the clock signal having a first clock frequency during the first state of the voltage selection signal and a second clock frequency during the second state of the voltage selection signal, and wherein the first clock frequency is higher than the second clock frequency.

In another embodiment, there is provided, a scannable flip-flop having an input and an output, the scannable flip-flop comprising: a master stage for receiving an input signal at the input and generating a master stage output signal; a slave stage coupled to the master stage for receiving the master stage output signal and generating a slave stage output signal; and a level shifter stage coupled to the slave stage for receiving the slave stage output signal and generating an output signal at the output; wherein the master stage and the slave stage are each supplied by a first voltage determined by a first state of a control signal and a second voltage determined by a second state of the control signal. The scannable flip-flop may further comprise: a P-channel transistor having a first current electrode coupled to a VDD voltage supply, a control electrode coupled to the scan enable signal, and a second current electrode for providing the first voltage; and an N-channel transistor having a first current electrode coupled to a VDD voltage supply, a control electrode coupled to the scan enable signal, and a second current electrode for providing the second voltage. During the first state of the control signal, the first voltage may be supplied to the flip-flop and to the level shifter, and during the second state of the control signal, the second voltage may be supplied to the flip-flop and the first voltage may be supplied to the level shifter. The master stage and the slave stage may receive a clock signal, the clock signal having a first clock frequency during the first state of the control signal and a second clock frequency during the second state of the control signal, and wherein the first clock frequency may be higher than the second clock frequency. The scannable flip-flop may further comprise a multiplexer coupled to the master stage, the multiplexer having a first input to receive a data signal, a second input to receive a scan data signal, and an output to provide the input signal for the master stage, and wherein the received data signal is coupled to the output during the first state of the control signal and the received scan data signal is coupled to the output during the second state of the control signal. During the second state of the control signal, the scan data signal voltage swing and level shifter output signal voltage swings are each from ground to the first voltage, and the master stage and the slave stage voltage swings are each from ground to the second voltage. The first voltage may be characterized as VDD and the second voltage may be substantially a threshold voltage below VDD.

In yet another embodiment, there is provided, a method for low power scan operation, the method comprising: providing a plurality of scannable flip-flops, the plurality of scannable flip-flops arranged in a scan chain; during a scan shift mode, reducing a supply voltage to a first portion of each of the scannable flip-flops; and during a scan capture mode, restoring the supply voltage to the first portion of each of the scannable flip-flops. The scan shift mode may further comprise supplying a second portion of each of the scannable flip-flops with a non-reduced supply voltage. The first portion may include a master-slave flip-flop and the second portion may include an input multiplexer coupled to a master stage of the flip-flop to provide an input signal and a level shifter coupled to the slave stage of the flip-flop to provide a level shifted output during a scan shift mode. The supply voltage may be characterized as VDD and wherein reducing the supply voltage comprises reducing the voltage to the first portion to a voltage substantially a threshold voltage below VDD.

Figure 2:
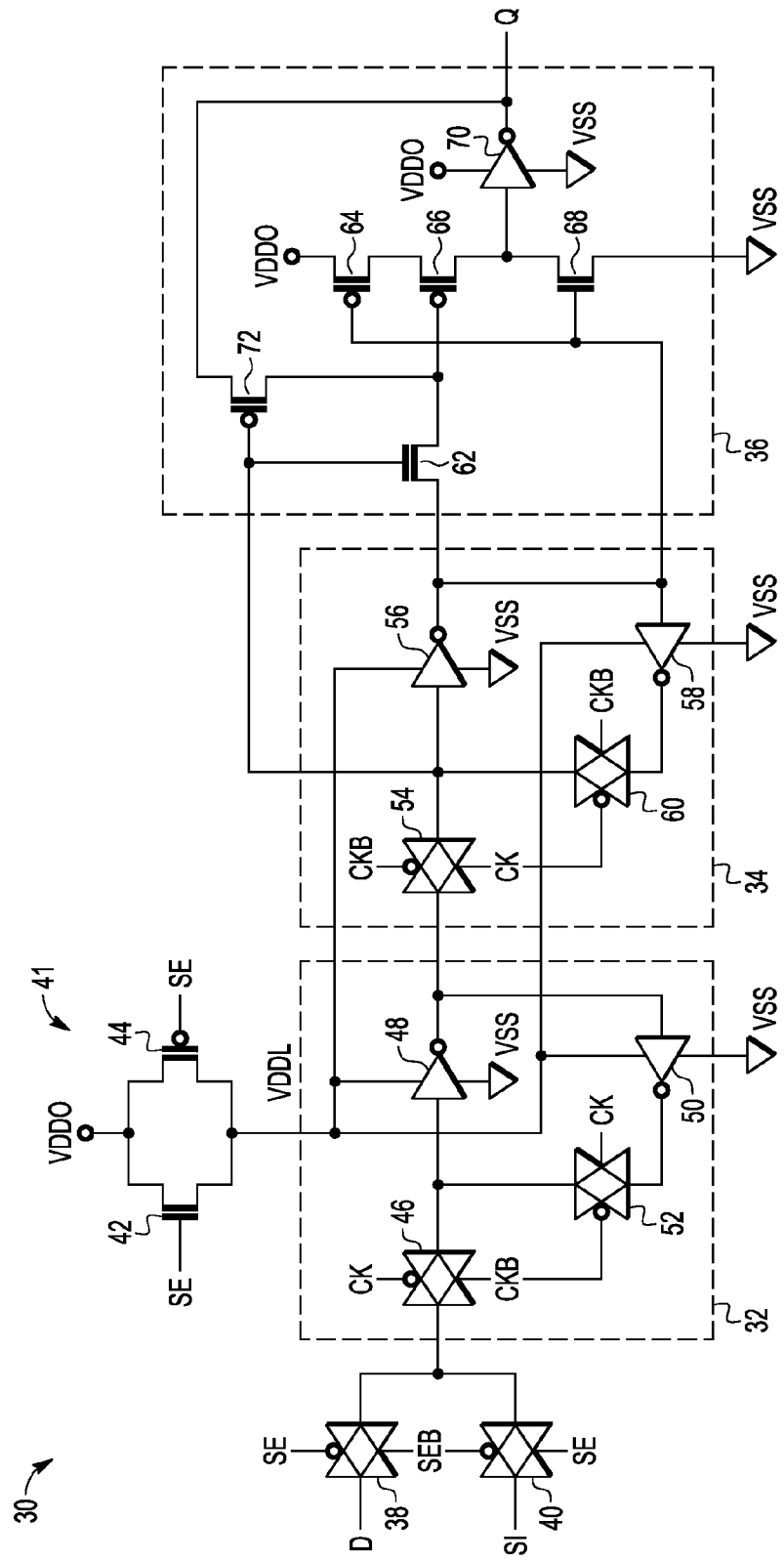
FIG. 2 illustrates, in block diagram form, a scannable flip-flop in the data processing system of FIG. 1.

FIG. 1 illustrates, in block diagram form, data processing system 10 in accordance with an embodiment. Data processing system 10 may be implemented on an integrated circuit. In one embodiment, data processing system 10 is a system-on-a-chip (SoC). Data processing system 10 includes bus 12, processor 14, memory 16, power management controller 18, clock gating logic 20, design-for-test (DFT) scan controller 22, and logic 24. Processor 14, memory 16, power management controller 18, and logic 24 are all bi-directionally connected to bus 12. Bus 12 can be any type of bus for communicating any type of information such as data, address, or instructions. Processor 14 may be any type of processor such as a microprocessor (MPU), microcontroller (MCU), digital signal processor (DSP), or other type of processing core. There may be multiple processors like processor 14. Memory 16 may be any type of volatile or non-volatile memory, such as static random access memory (SRAM), dynamic random access memory (DRAM), flash, etc. Memory 16 is also bi-directionally connected to processor 14. Power management controller 18 has a first output for providing control signals CONTROL to an input of clock gating logic 20, and a second output for providing a low power scan enable signal labeled "LP SCAN ENABLE signal to an input of DFT scan controller 22. Clock gating logic 20 has an output for providing clock signals CK and CKB to an input of logic 24. Design-for-test scan controller 22 has an output for providing scan enable signals SE and SEB to an input of logic 24. Clock signal CKB is a logical complement of CK and scan enable signal SEB is a logical complement of scan enable SE. Logic 24 includes circuits for providing specific functionality to data processing system 10. Also, logic 24 includes a plurality of flip-flops that can be scanned for testing purposes. Each of the flip-flops has an input for receiving complementary scan enable signals SE/SEB from DFT scan controller 22. An example flip-flop is illustrated in FIG. 2 and is discussed in detail below. When scan enable signal SE is asserted, all of the flip-flops will be connected into a long shift register. Complementary clock signals CK/CKB are used for controlling the operation of all of the flip-flops, including during scan-shift mode and capture mode. A pattern of test bits can be entered into the scan chain of flip-flops and then the state of the flip-flops can be read out for testing purposes.

When all of the flip-flops of data processing system 10 are operating in scan-shift mode, as determined by an asserted scan enable signal SE, there can be a large demand on the power supply because of the large number of flip-flops. Lowering the supply voltage during scan-shift mode reduces the current and therefore the power consumption of data processing system 10 when operating in scan-shift mode. Also, lowering the supply voltage to the flip-flops reduces the speed of the scan input data, thus reducing hold violations in the scan chain. In addition to lowering the supply voltage to the scan chain of flip-flops during scan-shift mode, the power supply voltage to each of the flip-flops can be lowered during a low power mode, such as stop mode, by also asserting the scan enable signal SE while the data processing system is in the low power mode.

FIG. 2 illustrates, in block diagram form, an example of a scannable flip-flop 30 of logic 24. There may hundreds or thousands of flip-flops similar to flip-flop 30 in data processing system 10. All of the flip-flops may operate in both a normal mode and in a scan-shift mode.

Flip-flop 30 includes master latch 32, slave latch 34, level shifter 36, transmission gates 38 and 40, and voltage selection circuit 41. Voltage selection circuit 41 includes N-channel transistor 42 and P-channel transistor 44. Master latch 32 includes transmission gates 46 and 52, and inverters 48 and 50. Slave latch 34 includes transmission gates 54 and 60 and inverters 56 and 58. Level shifter 36 includes N-channel transistors 62 and 68, P-channel transistors 64, 66, and 72, and inverter 70. In the illustrated embodiment, transmission gates 38, 40, 46, 52, 54, and 60 include parallel-connected N-channel and P-channel pairs of transistors. In other embodiments, the transmission gates may be simple pass gates each having a single N-channel or P-channel transistor.

Transmission gate 38 has a first terminal connected to receive an input data signal labeled "D", a second terminal, and true and complement control terminals for receiving scan enable signals SEB and SE, respectively. Transmission gate 40 has a first terminal connected to receive a scan-in signal labeled "SI", true and complement control terminals for receiving scan enable signals SE and SEB, respectively, and a second terminal connected to the second terminal of transmission gate 38. Transmission gates 38 and 40 perform a multiplexing function. Other types of multiplexing circuits may be used.

In voltage selection circuit 41, N-channel transistor 42 has a drain connected to a power supply voltage terminal labeled "VDDO", a gate for receiving scan enable signal SE, and a source connected to a power supply voltage node labeled "VDDL". P-channel transistor 44 has a source connected power supply voltage terminal VDDO, a gate for receiving scan enable signal SE, and a drain connected to power supply voltage node VDDL.

In master latch 32, transmission gate 46 has a first terminal connected to the second terminals of transmission gates 38 and 40, true and complement control terminals for receiving clock signals CKB and CK, respectively, and a second terminal. Inverter 48 has an input terminal connected to the second terminal of transmission gate 46, and an output terminal. Inverter 50 has an input terminal connected to the second terminal of inverter 48, and an output terminal. Transmission gate 52 has a first terminal connected to the output terminal of inverter 50, true and complement control terminals for receiving clock signals CK and CKB, respectively, and a second terminal connected to the input terminal of inverter 48. In another embodiment, inverter 50 and transmission gate 52 may be replaced with a tri-stateable inverter.

In slave latch 34, transmission gate 54 has a first terminal connected to the output terminal of inverter 48, true and complement control terminals for receiving clock signals CK and CKB, respectively, and a second terminal. Inverter 56 has an input terminal connected to the second terminal of transmission gate 54, and an output terminal. Inverter 58 has an input terminal connected to the output terminal of inverter 56, and an output terminal. Transmission gate 60 has a first terminal connected to the output terminal of inverter 58, true and complement control terminals for receiving clock signal CKB and CK, respectively, and a second terminal connected to the input terminal of inverter 56. In another embodiment, inverter 58 and transmission gate 60 may be replaced with a tri-stateable inverter.

In level shifter 36, N-channel transistor 62 has a first drain/source terminal connected to the output terminal of inverter 56, a gate connected to the second terminal of transmission gate 54, and a second drain/source terminal. P-channel transistor 64 has a source connected to power supply voltage terminal VDDO, a gate connected to the output terminal of inverter 56, and a drain. P-channel transistor 66 has a source connected to the drain of P-channel transistor 64, a gate connected to the second drain/source terminal of N-channel transistor 62, and a drain. N-channel transistor 68 has a drain connected to the drain of P-channel transistor 66, a gate connected to the output terminal of inverter 56, and a source connected to power supply terminal VSS. Inverter 70 has an input terminal connected to the drains of P-channel transistor 66 and N-channel transistor 68, and an output terminal for providing an output signal labeled "Q". P-channel transistor 72 has a first drain/source terminal connected to the output of inverter 70, a gate connected to the second terminal of transmission gate 56, and a second drain/source terminal connected to the gate of P-channel transistor 66.

Inverters 48, 50, 56, and 58 each has a first power supply voltage terminal connected to receive a variable power supply voltage at power supply voltage node VDDL, and a second power supply voltage terminal connected to a power supply voltage terminal labeled "VSS". In the illustrated embodiment, VDDL receives a positive power supply voltage and VSS is connected to ground. In other embodiments, the power supply voltages may be different. Flip-flop 30 is coupled to receive a power supply voltage through one of N-channel transistor 42 and P-channel transistor 44. In level shifter 36, inverter 70 is connected between power supply voltage terminals VDDO and VSS.

During normal operation of data processing system 10, scan enable SE is negated as a logic low. Clock signals CK/CKB operate at a normal mode operating frequency. The negated scan enable signal SE causes transmission gate 38 to be conductive and transmission gate 40 to be non-conductive, allowing a data signal D access to flip-flop 30 via transmission gate 38. Also, in voltage selection circuit 41, the negated scan enable signal SE causes N-channel transistor 42 to be substantially non-conductive, and P-channel transistor 44 to be conductive. The power supply voltage at power supply voltage node VDDL is substantially equal to the power supply voltage at power supply voltage terminal VDDO. Circuit operation of flip-flop 30 during normal mode is generally the same as for a conventional flip-flop. That is, when scan enable SE is low, transmission gate 38 is conductive and transmission gate 40 is non-conductive. Power supply voltage VDDL is equal to about VDDO because transistor 44 is conductive. For purposes of illustration, assume that data signal D is a logic one. When clock signal CK is low, clock signal CKB is high, transmission gate 46 is conductive allowing the logic one data D to be provided to inverter 48. The output of inverter 48 becomes a logic zero and the output of inverter 50 becomes a logic one. Transmission gates 52 and 54 are both non-conductive while clock signal CK is low. When clock signal CK transitions to a logic high, transmission gates 38 and 46 become non-conductive while transmission gates 50 and 54 become conductive. The logic zero at the output of inverter 48 is latched in the cross-coupled pair of inverters 48 and 50 of master latch 32. The logic zero is provided to the input of inverter 56 causing the output of inverter 56 to be a logic one. When clock signal CK becomes low again, transmission gate 60 becomes conductive, causing the logic one at the output of inverter 56 to be latched in the cross-coupled pair of inverters 56 and 58 of slave latch 34. The logic one at the output of inverter 56 is at the level of power supply voltage VDDO because the voltage of node VDDL is the same as VDDO during normal mode. The logic one at the output of inverter 56 is also provided to the gates of N-channel transistor 68 and P-channel transistor 64. N-channel transistor 68 is conductive, causing the input of inverter 70 to be pulled low to about VSS, or ground potential. The output Q of inverter 70 is a logic one and is provided at substantially the level of VDDO.

When data signal D is a logic zero, the operation of flip-flop 30 is the same as described above, except for the stored logic states of master latch 32 and slave latch 34. Also, the operation of level shifter 36 is different. When data signal D is a logic zero, the output of inverter 56 is a logic zero and N-channel transistor 68 is non-conductive while P-channel 64 is conductive. The logic one at the input of inverter 56 is provided to the gates of N-channel transistor 62 and P-channel transistor 72 causing N-channel transistor 62 to be conductive and P-channel transistor 72 to be non-conductive. The logic zero output of inverter 56 in provided to the gate of P-channel transistor via N-channel transistor 62. P-channel transistor 66 is conductive. Therefore, the conductive P-channel transistors 64 and 66 cause the input of inverter 70 to be pulled high. The output of inverter 70 is a logic low, or at the voltage level of VSS, or ground.

During testing, all of the flip-flops of logic 24 are connected together to form a scan-chain. With respect to a single flip-flop in the scan-chain, such as flip-flop 30, scan-shift mode generally works the same as a normal operation except the input signal is scan-in SI instead of data signal D. Scan-in SI is provided from another flip-flop in the scan chain instead of from a normal functional data path. To begin a scan-shift operation, scan enable signal SE is asserted as a logic high voltage and the clock frequency is reduced to a scan-shift mode frequency that is lower than the normal mode operating frequency. All of the flip-flops in the scan chain are powered by the reduced voltage when data processing system 10 is operating in scan-shift mode. The logic high scan enable signal SE causes transmission gate 40 to be conductive and transmission gate 38 to be non-conductive, thus passing the scan-in signal SI to master latch 32. The logic high scan enable signal SE also causes N-channel transistor 42 to be conductive, and P-channel transistor 44 to be non-conductive. A voltage at power supply voltage terminal VDDL will be equal to about VDDO minus a threshold voltage (VT) of N-channel transistor 42. Inverters 48, 50, 56, and 58 are powered at the lower voltage on VDDL while level converter 36 and the voltage levels of clock signals CK and CKB are at higher the VDDO voltage level. The lower voltage level at node VDDL causes the transistors of flip-flop 30 to switch more slowly so that a data signal will propagate more closely through flip-flop 30 and more closely match the reduced frequency of the clock signals CK and CKB. This may result in a reduction of hold violations in flip-flop 30 during scan-shift mode operation. The voltage level of level shifter 36 remains at VDDO during scan-shift operation. Level shifter 36 restores the voltage level of signals passing through flip-flop 30 during scan-shift mode from VDDO−VT to VDDO. Because there may be hundreds or thousands of flip-flops in a scan chain, a current surge reduction and power savings may be significant.

Figure 3:
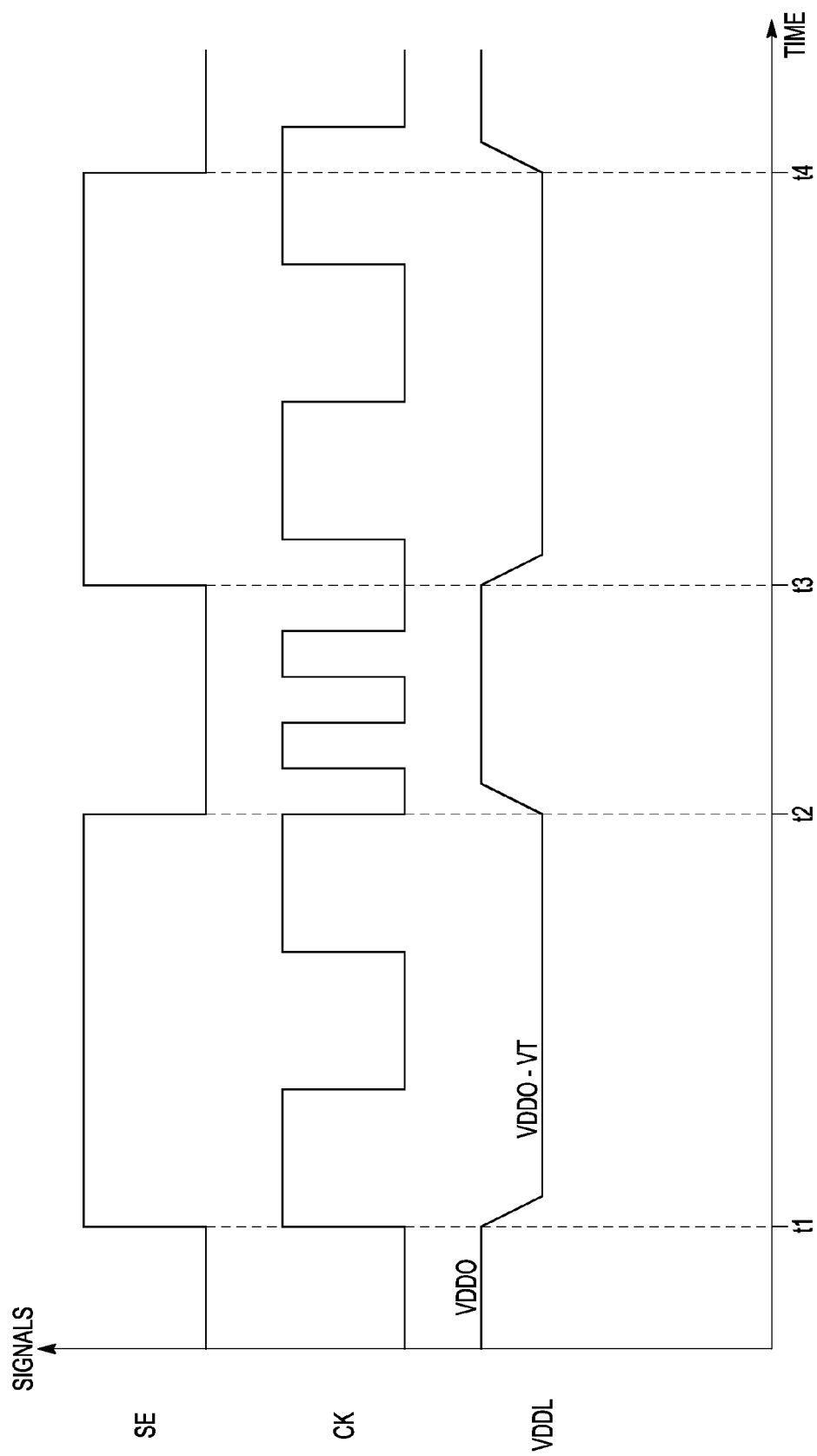
FIG. 3 illustrates a timing diagram of various signals during a scan-shift operating mode of the data processing system of FIG. 1.

FIG. 3 illustrates a timing diagram of various signals during scan-shift mode of data processing system 10 of FIG. 1. Prior to time t1, a logic low scan enable signal SE caused P-channel transistor 44 to be conductive and N-channel transistor 42 to be non-conductive. The power supply voltage provided to the master and slave latches via node VDDL is equal to about the voltage of VDDO. An asserted scan enable signal SE causes all of the flip-flops of data processing system 10 to be connected together in a scan chain and operate as described above. Enable signal SE is asserted as a logic high at time t1. After time t1, clock signal CK is at a lower frequency than the normal operating frequency. Also after time t1 and while enable signal SE is a logic high, N-channel transistor 41 is conductive and P-channel transistor 44 is substantially non-conductive. The voltage at node VDDL is reduced by an N-channel threshold voltage so that the voltage at VDDL is about VDDO−VT. The flip-flops in the scan chain operate in scan-shift mode between times t1 and t2. At time t2, scan enable signal SE is negated as a logic low voltage, and data processing system 10 enters a scan-capture mode. P-channel transistor 44 becomes conductive so that the voltage at node VDDL increases to power supply voltage VDDO. The frequency of clock signal CK increases during scan-capture mode as illustrated between times t2 and t3. At time t3, enable signal SE is re-asserted as a logic high and operation in scan-shift mode is resumed. In voltage selection circuit 41, N-channel transistor 42 is conductive and P-channel transistor 44 is non-conductive. The frequency of clock signal CK is reduced and the voltage at node VDDL again becomes VDDO−VT between times t3 and t4. At time t4, scan enable signal SE again is negated as a logic low. As discussed above, lowering the voltage to the flip-flops reduces power consumption and reduces the speed of the data path through the flip-flops. Reducing the speed of the data path reduces the number of hold violations during scan-shift mode operation.

Figure 4:
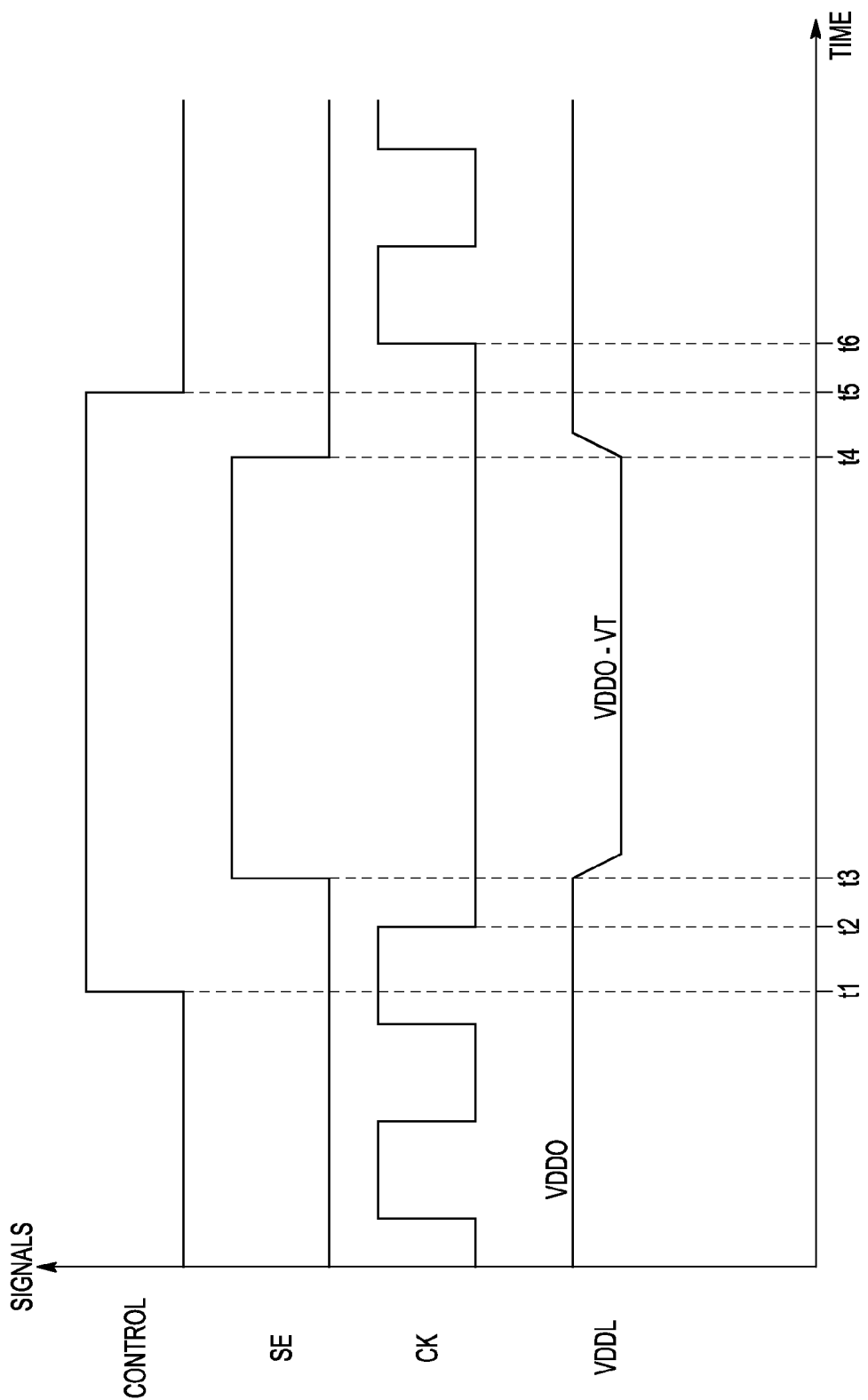
FIG. 4 illustrates a timing diagram of various signals during a low power operating mode of the data processing system of FIG. 1.

FIG. 4 illustrates a timing diagram of various signals during a stop mode of data processing system 10. Stop mode is a low power mode where the clock is stopped and the circuits are held in one state until operation in a normal operating mode resumes. Even though the circuits are not switching during stop mode, there may still be leakage current paths that undesirably consume power. The stop operating mode illustrated in FIG. 4 may provide lower power consumption because the master and slave latches are supplied with a low power supply voltage, thus reducing leakage current. In FIG. 4 prior to time t1, a stop mode control signal of CONTROLS (FIG. 1) is negated as a logic low causing data processing system 10 to operate in a normal operating mode. Also prior to time t1, scan enable SE is negated, clock signal CK is enabled. The negated scan enable signal SE causes P-channel transistor 44 to be conductive and N-channel transistor 42 to be non-conductive. The power supply voltage at node VDDL is equal to VDDO. When data processing system 10 enters stop mode, the CONTROL signal is asserted as a logic high causing clock signal CK to stop at time t2. At time t3, scan enable signal SE is asserted as a high, causing N-channel transistor 42 to be conductive and P-channel transistor 44 to be non-conductive. Power supply voltage node VDDL is decreased from VDDO to VDDO−VT. Between times t3 and t4 data processing system 10 is in stop mode and clock signal CK is stopped. At time t4, scan enable signal SE is negated as a logic low, causing the power supply voltage to the master and slave latches of flip-flop 30 to return to the voltage level of VDDO. Control signal CONTROL is negated at time t5 causing clock signal CK to resume at time t6. Stop mode is just one low power operating mode provided as an example implementation. Other low power modes may also be used.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A scannable flip-flop comprising:
   a flip-flop for receiving an input signal, and for generating a flip-flop output signal; and
   a voltage selection circuit coupled to the flip-flop, the voltage selection circuit for supplying a first voltage to the flip-flop during a first state of a voltage selection signal, and for supplying a second voltage to the flip-flop during a second state of the voltage selection signal, the voltage selection circuit comprising:
      a P-channel transistor having a first current electrode coupled to a VDD voltage supply, a control electrode coupled to the voltage selection signal, and a second current electrode for providing the first voltage; and
      an N-channel transistor having a first current electrode coupled to a VDD voltage supply, a control electrode coupled to the voltage selection signal, and a second current electrode for providing the second voltage.

2. The scannable flip-flop of claim 1, further comprising a level shifter coupled to the flip-flop, the level shifter for receiving the flip-flop output signal and for generating an output signal.

3. The scannable flip-flop of claim 2, wherein during the second state of the voltage selection signal, the second voltage is supplied to the flip-flop and the first voltage is supplied to the level shifter.

4. The scannable flip-flop of claim 1, wherein the first voltage is characterized as VDD and the second voltage is lower than VDD.

5. The scannable flip-flop of claim 4, wherein the second voltage is substantially a threshold voltage below VDD.

6. The scannable flip-flop of claim 1, wherein the voltage selection signal is characterized as a scan enable signal.

7. The scannable flip-flop of claim 1, wherein the voltage selection signal is in the second state during a low power mode.

8. The scannable flip-flop of claim 1, wherein the flip-flop receives a clock signal, the clock signal having a first clock frequency during the first state of the voltage selection signal and a second clock frequency during the second state of the voltage selection signal, and wherein the first clock frequency is higher than the second clock frequency.

9. A scannable flip-flop having an input and an output, the scannable flip-flop comprising:
   a master stage for receiving an input signal at the input and generating a master stage output signal;
   a slave stage coupled to the master stage for receiving the master stage output signal and generating a slave stage output signal;
   a level shifter stage coupled to the slave stage for receiving the slave stage output signal and generating an output signal at the output;
   a P-channel transistor having a first current electrode coupled to a VDD voltage supply, a control electrode coupled to a control signal, and a second current electrode for providing a first voltage; and
   an N-channel transistor having a first current electrode coupled to a VDD voltage supply, a control electrode coupled to the control signal, and a second current electrode for providing a second voltage;
   wherein the master stage and the slave stage are each supplied by the first voltage determined by a first state of the control signal and the second voltage determined by a second state of the control signal.

10. The scannable flip-flop of claim 9, wherein during the first state of the control signal, the first voltage is supplied to the flip-flop and to the level shifter, and during the second state of the control signal, the second voltage is supplied to the flip-flop and the first voltage is supplied to the level shifter.

11. The scannable flip-flop of claim 9, wherein the master stage and the slave stage receive a clock signal, the clock signal having a first clock frequency during the first state of the control signal and a second clock frequency during the second state of the control signal, and wherein the first clock frequency is higher than the second clock frequency.

12. The scannable flip-flop of claim 9, further comprising a multiplexer coupled to the master stage, the multiplexer having a first input to receive a data signal, a second input to receive a scan data signal, and an output to provide the input signal for the master stage, and wherein the received data signal is coupled to the output during the first state of the control signal and the received scan data signal is coupled to the output during the second state of the control signal.

13. The scannable flip-flop of claim 12, wherein during the second state of the control signal, the scan data signal voltage swing and level shifter output signal voltage swings are each from ground to the first voltage, and the master stage and the slave stage voltage swings are each from ground to the second voltage.

14. The scannable flip-flop of claim 9, wherein the first voltage is characterized as VDD and the second voltage is substantially a threshold voltage below VDD.

15. A method for low power scan operation, the method comprising:
   providing a plurality of scannable flip-flops, the plurality of scannable flip-flops arranged in a scan chain;
   during a scan shift mode, reducing a supply voltage to a first portion of each of the scannable flip-flops; and
   during a scan capture mode, restoring the supply voltage to the first portion of each of the scannable flip-flops.

16. The method of claim 15, wherein during a scan shift mode further comprises, supplying a second portion of each of the scannable flip-flops with a non-reduced supply voltage.

17. The method of claim 15, wherein the first portion includes a master-slave flip-flop, and the second portion includes an input multiplexer coupled to a master stage of the flip-flop to provide an input signal and a level shifter coupled to the slave stage of the flip-flop to provide a level shifted output during a scan shift mode.

18. The method of claim 15, wherein the supply voltage is characterized as VDD and wherein reducing the supply voltage comprises reducing the voltage to the first portion to a voltage substantially a threshold voltage below VDD.

19. The scannable flip-flop of claim 1, further comprising a multiplexer coupled to the flip flop, the multiplexer having a first input to receive a data signal, a second input to receive a scan data signal, and an output to provide the input signal for the flip flop, and wherein the received data signal is coupled to the output during the first state of the voltage selection signal and the received scan data signal is coupled to the output during the second state of the voltage selection signal.

20. The scannable flip-flop of claim 9, wherein the control signal is in the second state during a low power mode.

* * * * *